United States Patent [19]

Schwartz et al.

[11] Patent Number: 4,801,923
[45] Date of Patent: Jan. 31, 1989

[54] METHOD AND APPARATUS FOR DIGITAL TACAN OUTPUT CONVERSION

[75] Inventor: Robert J. Schwartz, Depew; Frederick G. Reinagel, Buffalo, both of N.Y.

[73] Assignee: LTV Aerospace & Defense Company, Dallas, Tex.

[21] Appl. No.: 633,024

[22] Filed: Jul. 20, 1984

[51] Int. Cl.$^4$ .............................................. H03M 1/74
[52] U.S. Cl. ................................................... 341/144
[58] Field of Search ................................. 340/347 DA

[56] References Cited

U.S. PATENT DOCUMENTS

| | | | |
|---|---|---|---|
| 2,877,398 | 3/1959 | Gimpel | 340/347 DA |
| 3,098,969 | 7/1963 | Liss | 340/347 DA |
| 3,273,143 | 9/1966 | Wasserman | 340/347 DA |
| 3,366,947 | 1/1968 | Kawashima | 340/347 DA |
| 3,579,227 | 5/1971 | Appelgren | 340/347 DA |

Primary Examiner—Charles D. Miller
Attorney, Agent, or Firm—S. S. Sadacca; J. M. Cate

[57] ABSTRACT

A method and apparatus are disclosed for converting a digital TACAN output into an analog potentiometer input suitable for an analog navigation computer. The apparatus includes an input register for temporarily storing a digital TACAN output signal. A nines complement generation circuit is utilized to generate the nines complement of the digital TACAN output signal and the nines complement is temporarily stored in a second register. The data in each register is then utilized to control one of two identical resistive circuits which are coupled to a common output node so that the total resistance in both circuits is always equal to a selected total resistance. In a preferred embodiment of the present invention, a plurality of optically coupled solid state relays are utilized to control the resistive circuits.

20 Claims, 2 Drawing Sheets

METHOD AND APPARATUS FOR DIGITAL TACAN OUTPUT CONVERSION

BACKGROUND OF THE INVENTION

This invention relates to Tactical Air Navigation (TACAN) in general and in particular to digital TACAN systems. Still more particularly, this invention relates to methods and apparatus for converting digital TACAN output signals into an analog potentiometer signal suitable for utilization with an analog navigation computer.

TACAN is a short range navigation system which can be utilized to provide continuous and accurate distance and bearing information. This information is generally visually presented utilizing a display instrument on an aircraft instrument panel. An integral part of the TACAN system is Distance Measuring Equipment (DME) which is utilized to calculate the range to the TACAN station or ground beacon.

DME is utilized to determine the distance or range to the TACAN ground beacon by measurement of the elapsed time between transmission of an interrogating pulse by an airborne TACAN set and reception of corresponding reply pulses from the ground beacon. The transmitter in the aircraft begins the interrogation process by sending out interrogation pulses at a low pulse repetition frequency. The ground beacon then triggers its transmitter which sends out the reply pulse signals. These signals require about twelve microseconds round trip travel time per nautical mile of distance from the ground beacon. A range indicator is then utilized to generate a visual indication of range to the beacon.

The range ouptut of a TACAN set is also commonly utilized in conjunction with a navigation computer to generate solutions to navigational problems. A problem which has recently arisen in this area occurs due to the fact that many manufacturers are now building TACAN sets which utilize digital output signals and many existing navigation computers are analog devices. That is, the range input required by these analog devices is a potentiometer type input. A simple digital to analog conversion is not feasible in these cases due to the nature of a potentiometer which varies the resistance of a single point while maintaining a constant voltage drop across the entire device.

It should therefore be apparent that a need exists for a method and apparatus for converting the digital range output of a TACAN set to an analog potentiometer type input for utilization with an analog navigation computer.

SUMMARY OF THE INVENTION

It is therefore one object of the present invention to provide an improved apparatus for converting digital TACAN output signals to an analog input for utilization with an analog navigation computer.

It is another object of the present invention to provide an improved method for converting digital TACAN output signals to an analog input for utilization with an analog navigation computer.

It is still another object of the present invention to provide an improved apparatus for converting digital output signals to an analog potentiometer input for utilization with an analog device.

The foregoing objects are achieved as is now described. The apparatus of the present invention includes an input register for temporarily storing a digital TACAN output signal. A nines complement generation circuit is utilized to generate the nines complement of the digital TACAN output signal and the nines complement is temporarily stored in a second register. The data in each register is then utilized to control one of two identical resistive circuits which are coupled to a common output node so that the total resistance in both circuits is always equal to a selected total resistance. In a preferred embodiment of the present invention, a plurality of optically coupled solid state relays are utilized to control the resistive circuits.

BRIEF DESCRIPTION OF THE DRAWINGS

The novel features believed characteristic of the invention are set forth in the appended claims. The invention itself; however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
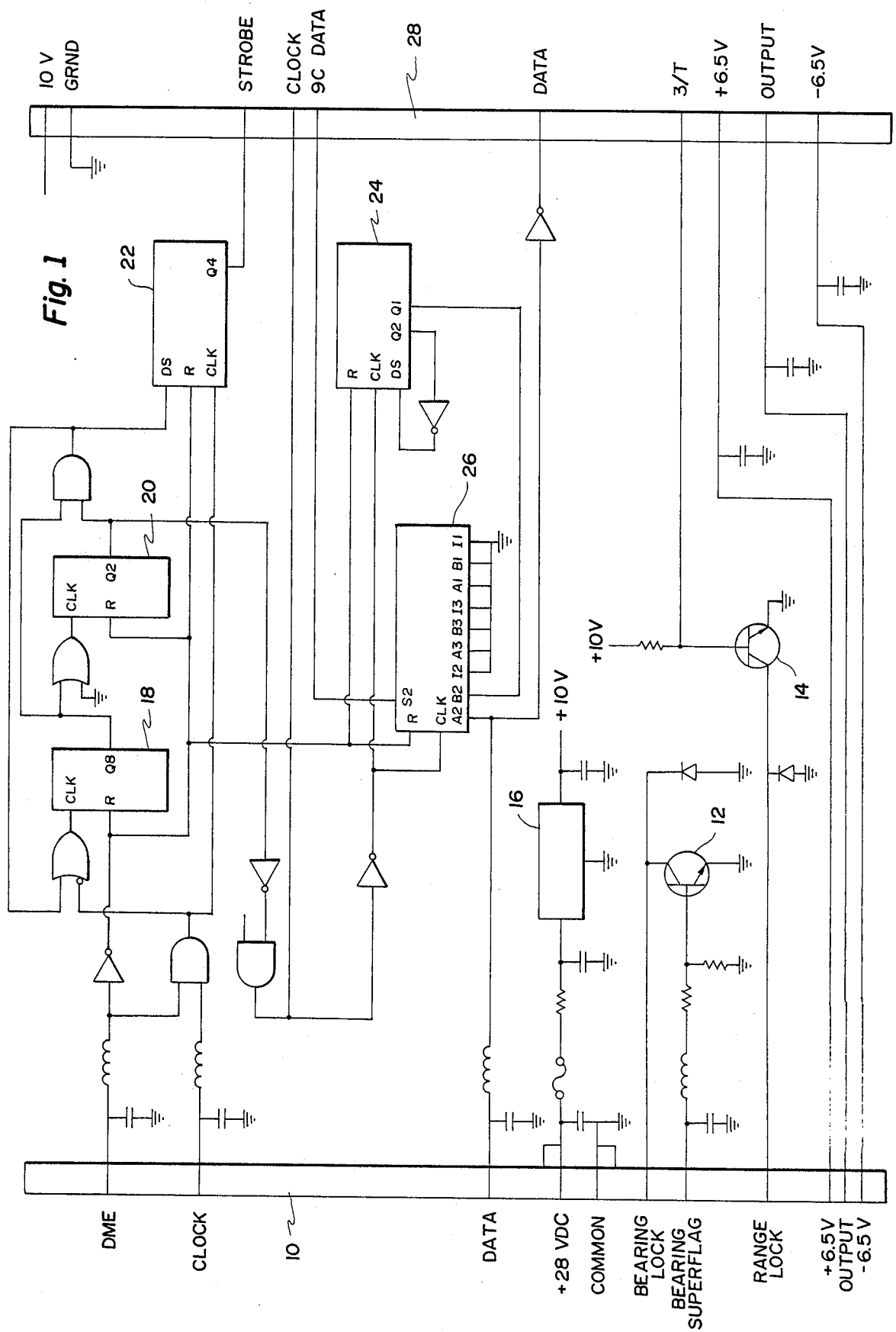
FIG. 1 is a schematic diagram of the nines complement generation circuitry and interface control circuitry of the apparatus of the present invention.

With reference now to the figures and in particular with reference to FIG. 1, there is depicted a schematic diagram of the nines complement generation circuitry and interface control circuitry of the conversion apparatus of the present invention. As can be seen, an electrical connector 10 is utilized to couple the components of FIG. 1 to a standard digital TACAN set such as Model SANS-706 manufactured by Sierra Research of Buffalo, N.Y., and to an analog navigation computer such as Model 6340L manufactured by Lear Siegler, Inc. Instrument Division of Grand Rapids, Mich.

Inputs from the TACAN set include a 28 volt DC power supply voltage, a clock input, a data input, and a DME require input. The navigation computer supplies a $\pm 6.5$ volt reference potential to the high and low side of the range potentiometer. Additionally, the bearing superflag input is utilized in conjunction with transistor 12 to generate the bearing lock signal and transistor 14 is utilized to generate a range lock signal when a conversion has taken place. Voltage regulator 16 is utilized to regulate the 28 volt DC power supply voltage input to a 10 volt DC power supply voltage which is utilized throughout the circuitry of FIG. 1 and FIG. 2.

The DME request signal and the clock input are utilized in conjunction with synchronous decade counters 18 and 20, shift register 22 and the associated logic circuitry to generate a strobe signal and a clock signal for timing and controlling the operation of the circuitry of the present invention. A second shift register 24 is utilized as a serial nine generator and in conjunction with serial adder 26 is utilized to generate the nines complement of the digital data range output of the TACAN set. In a preferred mode of the present invention, shift registers 22 and 24 are dual four bit serial in, parallel out shift registers such as the Model 4015B manufactured by Radio Corporation of America, of Princeton, N.J. Similarly, serial adder 26 may be implemented utilizing a Model 4032B triple serial adder also manufactured by Radio Corporation of America. Finally, a second electrical connector 28 is utilized to couple the strobe and clock signals, the reference voltages and both the digital data range output of the TACAN set and the nines complement of that data to the digitially controlled resistor networks of FIG. 2.

Figure 2:
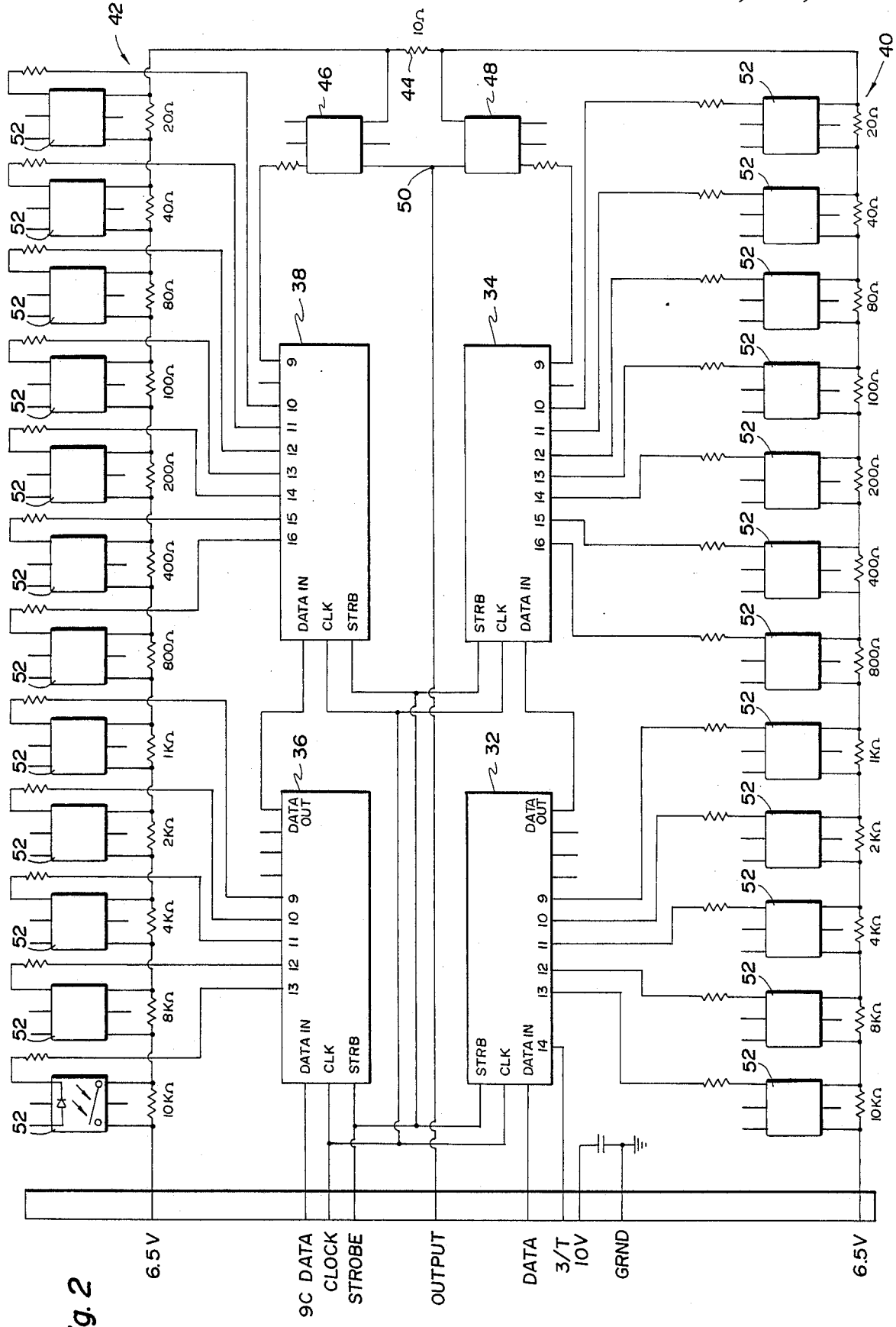
FIG. 2 is a schematic diagram of the digitally controlled resistor networks of the present invention.

Referring now to FIG. 2, it can be seen that electrical connector 30 is provided to couple the circuitry of FIG. 2 to electrical connector 28 of FIG. 1. Those skilled in the art will appreciate that in an actual physical embodiment of the present invention, two separate printed circuit boards may be utilized to support the circuitry of FIGS. 1 and 2 and connectors 10, 28 and 30 may simply be edge connectors with appropriate wiring to couple the various boards together. As is illustrated, the digital data range output of the TACAN set is serially coupled into eight bit serial input latched drivers 32 and 34 while the nines complement of that data is similarly serially coupled into identical eight bit serial input latched drivers 36 and 38. Preferably, latched drivers 32, 34, 36 and 38 all contain an eight bit shift register with associated latch circuits for each bit. High impedance inputs are preferred to cause minimal loading of the data input lines and the serial operation of each latched driver will permit the cascaded operation depicted. In the preferred embodiment of the present invention, latched drivers 32, 34, 36 and 38 are preferably provided utilizing the series UCQ 4821R driver which is manufactured and distributed by the Semiconductor Division of Sprague Electric Company of Worchester, Mass.

Also depicted in FIG. 2 is an identical pair of serially coupled precision resistor networks 40 and 42. As can be seen, resistor networks 40 and 42 are identical and each network includes twelve serially coupled precision resistors ranging in resistance from 10,000 ohms to 20 ohms. As those skilled in the art will appreciate, the tolerance of each resistor which is necessary to provide a total system tolerance within desired design characteristics will vary with the total amount of resistance of each individual resistor. For example, a one percent tolerance in a 10,000 ohm resistor will generate a much larger error than a similar tolerance in a 20 ohm resistor. For this reason, it has been determined that the larger resistors (those over 400 ohms) should have a tolerance of 0.1 percent while the smaller resistors can have a tolerance of 1 percent.

Still referring to FIG. 2, it can be seen that resistor networks 40 and 42 are both coupled to resistor 44 a ten ohm resistor and through either output relay 46 or output relay 48 to common output node 50. The opposing ends of resistor networks 40 and 42 are coupled to the negative and positive 6.5 volt supply respectively, and resistor 44 is coupled to either resistor network 40 or resistor network 42.

The total amount of resistance present in resistor networks 40 and 42 can now be selectively varied by the operation of solid state relays 52, 46 and 48. Each resistor within resistor networks 40 and 42 is coupled between the normally open contacts of a solid state relay 52 and activation of any selected solid state relay 52 will effectively electrically short out its associated resistor. Solid state relays 52 are preferably optically coupled solid state relays such as the series OMA-130 manufactured by Theta-J Corporation of Wakefield, Mass., utilizing VMOS circuit devices. The utilization of optically coupled relays permits a high degree of input isolation and VMOS technology allows a relatively high power handling capability. In the depicted embodiment of the present invention, output relays 46 and 48 are also provided utilizing the series OMA-130 solid state relay. Output relays 46 and 48 determine, via the data input, whether least significant resistor 44 (10Ω) is in the "high" or "low" resistor network. This method of switching the resistor 44 between the two networks allows the elimination of one resistance by "sharing" resistor 44. One network would always have an extra 10Ω resistor shorted if the other has this resistor active, since a digital number and its nines complement cannot both be even or odd.

In operation, the apparatus of the present invention will convert a digital TACAN range output to an analog potentiometer type output by controlling resistor network 40 utilizing the digital TACAN range output signal and by simultaneously controlling an identical resistor network 42 utilizing the nines complement of the digital TACAN range output. In this manner, by utilizing the nines complement of the digital TACAN range output, the total amount of resistance in resistor networks 40 and 42 will remain constant, and therefore, the current through both networks will remain constant. By varying the amount of resistance present above and below output node 50, the output of the potentiometer output while totally isolating the digital circuitry from the analog potentiometer output. Those skilled in the electronics art will appreciate that by utilizing the various resistor values depicted in resistor networks 40 and 42 and resistor 44, output node 50 can be made to resemble the output of a 20,000 ohm potentiometer which may vary in 10 ohm steps. This technology, while depicted in conjunction with a digital TACAN output signal, can also be applied to other situations in which it is desired to convert a digital control signal to a potentiometer type output, such as in automatic gain control and digitally controlled volume circuitry.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

What is claimed is:

1. An apparatus for converting a digital data input into an analog potentiometer output comprising:
   input register means for receiving digital data;
   complement generation means for generating the complement of said selected digital data;
   a first plurality of serially coupled resistive circuit elements coupled at a first end thereof to a selected output node;
   a second plurality of serially coupled resistive circuit elements coupled at a first end thereof to said selected output node;
   a common resistive circuit element;
   means for alternately coupling said common resistive circuit element to said first and second plurality of serially coupled resistive circuit elements in response to at least one of said selected digital data and the complement of said selected digital data;
   means for electrically shorting selected ones of said first plurality of serially coupled resistive circuit elements in response to said selected digital data; and means for electrically shorting selected ones of said second plurality of serially coupled resistive circuit elements in response to the complement of said selected digital data.

2. Apparatus for converting a digital data input into an analog potentiometer output according to claim 1 wherein said complement generation means for generating the complement of said selected digital data generates the nines complement of said selected digital data.

3. Apparatus for converting a digital data input into an analog potentiometer output according to claim 1 wherein said first and second pluralities of serially coupled resistive circuit elements are identical.

4. Apparatus for converting a digital data input into an analog potentiometer output according to claim 1 wherein said means for electrically shorting selected ones of said first and second pluralities of serially coupled resistive circuit elements comprises a plurality of solid state metal oxide semiconductor relay circuits.

5. Apparatus for converting a digital data input into an analog potentiometer output according to claim 4 wherein said plurality of solid state metal oxide semiconductor relay circuits are optically coupled.

6. Apparatus for converting a digital data input into an analog potentiometer output according to claim 1 further including a first selected electrical voltage coupled to a second end of said first plurality of serially coupled resistive circuit elements.

7. Apparatus for converting a digital data input into an analog potentiometer input according to claim 6 further including a second selected electrical voltage coupled to a second end of said second plurality of serially coupled resistor circuit elements.

8. Apparatus for converting a digital data input into an analog potentiometer output according to claim 7 wherein said second selected voltage is equal to and of opposite polarity to said first selected voltage.

9. An apparatus for converting digital TACAN output data into an analog potentiometer input for an analog navigation computer comprising:
   input register means for periodically receiving digital TACAN output data;
   complement register means for receiving said complement of said digital TACAN output data;
   a first plurality of serially coupled resistor circuit elements coupled at a first end thereof to a selected output node;
   a second plurality of serially coupled resistive circuit elements coupled at a first end thereof to said selected output node;
   a common resistive circuit element;
   means for alternately coupling said common resistive circuit element to said first and second plurality of serially coupled resistive circuit elements in response to at least one of said selected digital data and the complement of said selected digital data;
   means coupled to said input register means for electrically shorting selected ones of said first plurality of serially coupled resistive circuit elements in response to said digital TACAN output data; and
   means coupled to said complement register means for electrically shorting selected ones of said second plurality of serially coupled resistive circuit elements in response to the complement of said digital TACAN output data.

10. Apparatus for converting digital TACAN output data into an analog potentiometer input for an analog navigation computer according to claim 9 wherein said complement generation means for generating the complement of said digital TACAN output data generates the nines complement of said digital TACAN output data.

11. Apparatus for converting digital TACAN output data into an analog potentiometer input for an analog navigation computer according to claim 9 wherein said first and second pluralities of serially coupled resistive circuit elements are identical.

12. Apparatus for converting digital TACAN output data into an analog potentiometer input for an analog navigation computer according to claim 9 wherein said means for electrically shorting selected ones of said first and second pluralities of serially coupled resistive circuit elements comprises a plurality of solid state metal oxide semiconductor relay circuits.

13. Apparatus for converting digital TACAN output data into an analog potentiometer input for an analog navigation computer according to claim 12 wherein said plurality of solid state metal oxide semiconductor relay circuits are optically coupled.

14. Apparatus for converting digital TACAN output data into an analog potentiometer input for an analog navigation computer according to claim 9 further including a first selected electrical voltage coupled to a second end of said first plurality of serially coupled resistive circuit elements.

15. Apparatus for converting digital TACAN output data into an analog potentiometer input for an analog navigation computer according to claim 14 further including a second selected electrical voltage coupled to a second end of said second plurality of serially coupled resistor circuit elements.

16. Apparatus for converting digital TACAN output data into an analog potentiometer input for an analog navigation computer according to claim 15 wherein said second selected voltage is equal to and of opposite polarity to said first selected voltage.

17. A method of converting a digital data input into an analog potentiometer output comprising the steps of:
   storing digital data;
   generating the complement of said stored digital data;
   utilizing the stored digital data to control a first resistive circuit;
   utilizing the generated complement of said stored digital data to control a second resistive circuit; and
   utilizing at least one of the stored digital data and the generated complement of said stored digital data to alternately couple a common resistive circuit element to the first and second resistive circuits.

18. The method of converting a digital data input into an analog potentiometer output according to claim 17 wherein said complement of said stored digital data is the nines complement.

19. The method of converting a digital data input into an analog potentiometer output according to claim 17 wherein said stored digital data is utilized to control a first resistive circuit by selectively electrically shorting said selected ones of a plurality of serially coupled resistors.

20. The method of converting a digital data input into an analog potentiometer output according to claim 17 further comprising coupling a selected electrical voltage to at least one of said first and second resistive circuits.

* * * * *